US009307638B2

United States Patent
Park et al.

(10) Patent No.: US 9,307,638 B2
(45) Date of Patent: Apr. 5, 2016

(54) FLEXIBLE METAL LAMINATE

(71) Applicant: LG CHEM, LTD., Seoul (KR)

(72) Inventors: Young Seok Park, Daejeon (KR); Soon Yong Park, Daejeon (KR); Se Myung Jang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/357,855

(22) PCT Filed: Jul. 11, 2013

(86) PCT No.: PCT/KR2013/006214
§ 371 (c)(1),
(2) Date: May 13, 2014

(87) PCT Pub. No.: WO2014/010968
PCT Pub. Date: Jan. 16, 2014

(65) Prior Publication Data
US 2014/0308478 A1 Oct. 16, 2014

(30) Foreign Application Priority Data

Jul. 11, 2012 (KR) .................. 10-2012-0075601
Jul. 11, 2013 (KR) .................. 10-2013-0081375

(51) Int. Cl.
*H05K 1/03* (2006.01)
*H05K 1/05* (2006.01)
*H05K 3/02* (2006.01)

(52) U.S. Cl.
CPC ............ *H05K 1/0353* (2013.01); *H05K 1/0373* (2013.01); *H05K 1/0393* (2013.01); *H05K 3/022* (2013.01); *H05K 2201/015* (2013.01); *H05K 2201/0154* (2013.01); *Y10T 428/24355* (2015.01); *Y10T 428/25* (2015.01);
(Continued)

(58) Field of Classification Search
CPC .... H05K 1/05; H05K 1/03; Y10T 428/24355; Y10T 428/25; Y10T 428/263; Y10T 428/264; Y10T 428/266; Y10T 428/3154; Y10T 428/31544
USPC .................................... 428/98, 421, 511, 458
See application file for complete search history.

(56) References Cited

U.S. PATENT DOCUMENTS

| 4,816,516 A | 3/1989 | Yamaya et al. |
| 5,011,727 A | 4/1991 | Kido et al. |

(Continued)

FOREIGN PATENT DOCUMENTS

| CN | 1764534 A | 4/2006 |
| CN | 101006148 A | 7/2007 |

(Continued)

OTHER PUBLICATIONS

Aveica, Solsperse 36600 Data Sheet, Apr. 2001.*
(Continued)

*Primary Examiner* — Aaron Austin
*Assistant Examiner* — Michael Zhang
(74) *Attorney, Agent, or Firm* — Rothwell, Figg, Ernst & Manbeck, P.C.

(57) ABSTRACT

There is provided a flexible metal laminate including a polymer resin layer including a polyimide resin of a specific structure and a fluororesin, wherein the fluororesin is more distributed through the inside of the polymer resin layer than at the surface of the polymer resin layer.

21 Claims, 2 Drawing Sheets

(52) U.S. Cl.
CPC .......... *Y10T428/263* (2015.01); *Y10T 428/264* (2015.01); *Y10T 428/266* (2015.01); *Y10T 428/3154* (2015.04); *Y10T 428/31544* (2015.04)

(56) References Cited

U.S. PATENT DOCUMENTS

| | | | |
|---|---|---|---|
| 5,240,775 A * | 8/1993 | Tannenbaum | 428/422 |
| 6,017,639 A * | 1/2000 | Higginbotham et al. | 428/458 |
| 7,026,032 B2 * | 4/2006 | Lee et al. | 428/98 |
| 2005/0096429 A1 | 5/2005 | Lee et al. | |
| 2006/0003168 A1 * | 1/2006 | Dadalas et al. | 428/421 |
| 2007/0042202 A1 * | 2/2007 | Park et al. | 428/458 |
| 2007/0060698 A1 * | 3/2007 | Tomihashi et al. | 524/520 |
| 2008/0286484 A1 * | 11/2008 | Tojo et al. | 427/511 |
| 2009/0311519 A1 * | 12/2009 | Nagata et al. | 428/336 |
| 2012/0101213 A1 * | 4/2012 | Tajiri et al. | 524/538 |
| 2013/0065018 A1 * | 3/2013 | Park et al. | 428/141 |

FOREIGN PATENT DOCUMENTS

| | | |
|---|---|---|
| JP | 56-7490 A | 1/1981 |
| JP | 63-224934 A | 9/1988 |
| JP | 2-286743 A | 11/1990 |
| JP | 2890747 B2 | 5/1999 |
| JP | 2002-361792 A | 12/2002 |
| JP | 2003227467 A | 8/2003 |
| JP | 2004195776 A | 7/2004 |
| JP | 2005-142572 A | 6/2005 |
| JP | 2005-310973 A | 11/2005 |
| JP | 2007-500762 A | 1/2007 |
| KR | 10-0786956 B1 | 12/2007 |
| KR | 20120067574 A | 6/2012 |
| WO | 2005/012423 A1 | 10/2005 |

OTHER PUBLICATIONS

Agilent, Material Expansion Coefficients, 2002.*

* cited by examiner

FLEXIBLE METAL LAMINATE

CROSS REFERENCE TO RELATED APPLICATION(S)

This application is a 35 U.S.C. §371 National Phase Entry Application from International Application PCT/KR2013/006214, filed on Jul. 11, 2013, which claims under 35 U.S.C. §119 priority to and the benefit of Korean Patent Application No. 10-2012-0076501, filed Jul. 11, 2012, Korean Patent Application No. 10-2013-0081375, filed Jul. 11, 2013, the disclosures of which are incorporated herein by reference in their entireties.

TECHNICAL FIELD

The present invention relates to a flexible metal laminate, and specifically relates to a flexible metal laminate which has a low dielectric constant and low moisture regain and can secure high elasticity and an optimized coefficient of thermal expansion.

BACKGROUND OF THE INVENTION

Following the recent trend of miniaturization, high speed, and unification of various functions of electronic devices, the signal propagation velocity within electronic devices or the signal propagation velocity outside of electronic devices is getting faster.

Accordingly, a printed circuit board using an insulator having a lower dielectric constant and a lower dielectric loss coefficient than prior insulators is becoming necessary. Reflecting this trend, recent attempts to apply a liquid crystalline polymer (LCP), which is an insulator having a lower dielectric constant and that is less influenced by moisture absorption than a prior polyimide, to a flexible printed circuit board have been made.

However, even if the LCP is applied thereto, the degree of improvement is insignificant because the dielectric constant of the LCP (Dk=2.9) is not significantly different from that of polyimide (Dk=3.2), and there is a problem that the compatibility with a PCB preparation process using the prior polyimide in a via hole process using a laser because the LCP has low thermal resistance to cause a problem in a soldering process and has thermal plasticity.

Therefore, there have been efforts to lower the dielectric constant of the polyimide being used as an insulator of prior flexible circuit boards as the solution to the problem. For example, U.S. Pat. No. 4,816,516 disclosed a method of preparing a molded product by mixing a polyimide and a fluoropolymer. However, the patent relates not to an electronic product requiring a low dielectric constant but to a molded product, and it uses a polyimide having a high thermal expansion rate and a low glass transition temperature. Further, it is required to form the polyimide resin into a thin film in order to use the same on a printed circuit board, but the above U.S. patent document does not disclose a copper foil laminate prepared into a thin film.

Furthermore, according to U.S. Pat. No. 7,026,032, a method of lowering the dielectric constant of a product prepared by dispersing fluoropolymer fine powders through a polyimide is disclosed. The above U.S. patent document discloses that the fluoropolymer fine powders are more dispersed in the outer surface than the inner core of the insulator. However, as disclosed in the above U.S. patent document, overall moisture regain of the same can be reduced because the fluoropolymer is plentiful in the outer layer of the insulator and moisture penetration and absorption are lowered because of a fluororesin at the outer surface, but there may be a problem that has not appeared in flexible copper foil laminates composed of the prior polyimide. For example, the polyimide resin disclosed in the above U.S. patent document may become inferior in adhesive strength with a coverlay, a prepreg, or an ACF, the coefficient of thermal expansion (CTE) of the polyimide disclosed in the above U.S. patent document is too large to be applied to a flexible copper foil laminate, and the fluororesin may melt at a temperature of around 380° C. which is applied to the storage process of PCB preparation. There is also a risk that the copper foil circuit may be exfoliated because too much fluororesin exists in the outer surface of the polyimide.

Therefore, it is required to develop a polyimide material having not only a low dielectric constant and a low coefficient of thermal expansion by including a fluororesin in a polyimide, but also having a high elastic modulus and low moisture regain.

PRIOR ART DOCUMENTS

Patent Documents (Patent document 1) (Prior document 001) U.S. Pat. No. 4,816,516

(Patent document 2) (Prior document 001) U.S. Pat. No. 7,026,032

DETAILED DESCRIPTION OF THE INVENTION

Technical Objectives

It is an aspect of the present invention to provide a flexible metal laminate which has a low dielectric constant and low moisture regain and that can secure high elasticity and an optimized coefficient of thermal expansion.

Technical Solutions

There is provided a flexible metal laminate, including a polymer resin layer including a polyimide resin including a repeating unit represented by the following Chemical Formula 1 and a fluororesin, wherein the fluororesin is more distributed through the inside of the polymer resin layer than at the surface of the polymer resin layer.

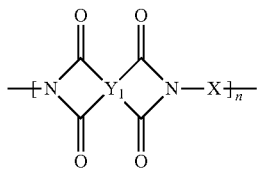

[Chemical Formula 1]

In Chemical Formula 1, $Y_1$ is a tetravalent aromatic organic functional group, X is a divalent aromatic organic functional group, and n is an integer of 1 to 300. Hereinafter, the flexible metal laminate according to the specific embodiment of the present invention is explained in more detail.

According to one embodiment of the present invention, a flexible metal laminate including a polymer resin layer including a polyimide resin including the repeating unit represented by Chemical Formula 1 and a fluororesin, wherein the fluororesin is more distributed through the inside of the polymer resin layer than at the surface of the polymer resin layer, may be provided.

Heretofore, methods of adding a fluoropolymer resin to a polymer resin such as a polyimide being applied to a flexible metal laminate in order to lower the dielectric constant have been known. However, there is a limit that the overall coefficient of thermal expansion cannot help but increase because the coefficient of thermal expansion of polytetrafluoroethylene (PTFE), a tetrafluoroethylene-hexafluoropropylene copolymer (FEP), and perfluoroalkox (PFA), the representative fluororesins, reach 135 ppm, 150 ppm, and 230 ppm, respectively, and they are considerably larger than 10 to 30 ppm, the coefficient of thermal expansion of a common polyimide, and about 10 to 60 wt % of such fluororesin is required in order to sufficiently lower the dielectric constant of a polyimide. Therefore, the present inventors progressed related studies, and through experiments, recognized the fact that the flexible metal laminate can have a low dielectric constant and low moisture regain and can secure high elasticity and an optimized coefficient of thermal expansion when the flexible metal laminate of one embodiment of the invention includes a polymer resin layer including a polyimide resin having a specific chemical structure and a fluororesin, wherein the fluororesin is more distributed through the inside of the polymer resin layer than at the surface of the polymer resin layer, and accomplished the present invention.

As disclosed above, in the polymer resin layer of the flexible metal laminate, the fluororesin may be more distributed through the inside of the polymer resin layer than at the surface of the polymer resin layer, and the content of the fluororesin may increase toward the inside of the polymer resin layer.

Specifically, in the flexible metal laminate, the content of the fluororesin per unit volume of the polymer resin layer may increase to a depth of 20% of the total thickness from the surface of the polymer resin layer.

Further, the content of the fluororesin per unit volume of the polymer resin layer may be a minimum at the surface of the polymer resin layer.

For example, the content of fluororesin included in a unit volume until the depth of 1% of the total thickness from the surface of the polymer resin layer (for example, a cube of which the length of one edge is the corresponding depth) may be less than the content of fluororesin included in a unit volume at the inside deeper than the depth of 1% of the total thickness.

As disclosed above, the content of the fluororesin per unit volume is the minimum at the surface of the polymer resin layer and the content of the fluororesin per unit volume may increase until 20% of the total thickness from the surface of the polymer resin layer is reached.

The content of fluororesin may increase until 20% of the total thickness from the surface of the polymer resin layer is reached, and the content of fluororesin may further increase or maintain the content at the depth of 20% of the total thickness within the range of 20% to 50% of the total thickness from the surface. As the content of fluororesin increases gradually through the inside of the polymer resin layer until 20% of the total thickness is reached, the weight ratio of the polyimide resin and the fluororesin per unit volume of the polymer resin layer changes with the depth.

Specifically, the weight ratio of the polyimide resin to the fluororesin per unit volume of the polymer resin layer may be 100:0 to 60:40 at the depth of 20% of the total thickness from the surface of the polymer resin layer. Further, the weight ratio of the polyimide resin to the fluororesin per unit volume of the polymer resin layer may be 80:20 to 30:70 at a depth of 40% to 60% of the total thickness of the polymer resin layer.

In this way, as the fluororesin is more distributed through the inside of the polymer resin layer than at the surface of the same, the content of the fluororesin increases with the depth toward the inside of the polymer resin, or the content of the fluororesin per unit volume of the polymer resin is the minimum at the surface of the polymer resin, the effects of including the fluororesin in the polymer resin layer, for example low dielectric constant and low moisture regain, can be sufficiently exhibited and it becomes possible to minimize the phenomenon of increasing the coefficient of thermal expansion of the polymer resin layer or decreasing the elastic modulus of the same caused by the fluororesin.

Furthermore, according to the distribution aspect of the fluororesin, the polymer resin layer may be more firmly combined with a metal thin film included in a flexible metal laminate, and the difference in coefficient of thermal expansion between other polymer resin layers (for example, a second or third polyimide layer) which may be additionally connected to at least one face of the polymer resin layer, may be largely reduced.

As the fluororesin is more distributed through the inside of the polymer resin layer than at the surface of the same, it is possible to prevent the phenomenon that the fluororesin melts or the copper foil circuit is exfoliated from the insulation at a high temperature, for example at a temperature of around 380° C. which may be applied during the preparation of the flexible metal laminate or the printed circuit board.

It appears that the characteristics of the flexible metal laminate of the above embodiment are because of the distribution characteristic of the fluororesin in the polymer layer in company with the use of a polyimide resin having the specific chemical structure.

Specifically, the polyimide resin including the repeating unit represented by Chemical Formula 1 may include a tetravalent functional group selected from the group consisting of the compounds of the following Chemical Formulae 21 to 27.

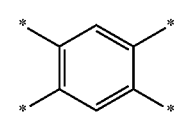

[Chemical Formula 21]

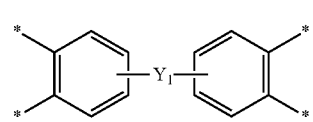

[Chemical Formula 22]

In Chemical Formula 22, $Y_1$ is single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are respectively an integer of 1 to 10.

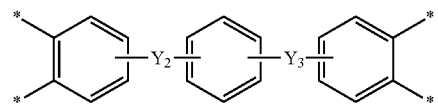

[Chemical Formula 23]

In Chemical Formula 23, $Y_2$ and $Y_3$ may be same as or different from each other and are respectively a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are respectively an integer of 1 to 10.

[Chemical Formula 24]

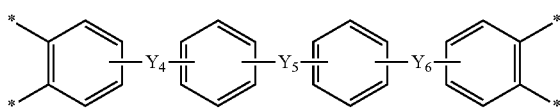

In Chemical Formula 24, $Y_4$, $Y_5$, and $Y_6$ are same as or different from each other and are respectively a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are respectively an integer of 1 to 10.

[Chemical Formula 25]

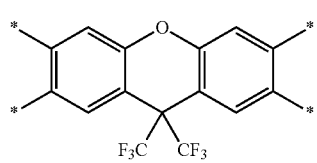

[Chemical Formula 26]

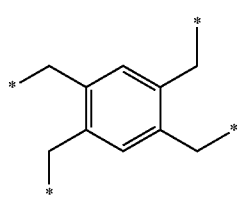

[Chemical Formula 27]

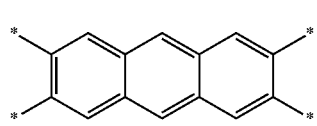

In Chemical Formulae 21 to 27, "*" means a bonding point. Further, $Y_1$ of Chemical Formula 1 is preferably a tetravalent functional group selected from the group consisting of the compounds of the following Chemical Formulae 28 to 30 so that the flexible metal laminate has a lower dielectric constant and lower moisture regain and secures high elasticity and an optimized coefficient of thermal expansion.

In Chemical Formula 1, $Y_1$ of each repeating unit may be same as or different from each other.

[Chemical Formula 28]

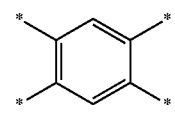

[Chemical Formula 29]

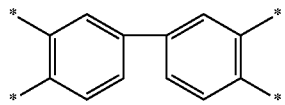

[Chemical Formula 30]

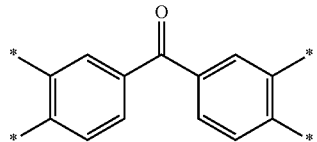

In Chemical Formulae 28 to 30, "*" means a bonding point. Meanwhile, in Chemical Formula 1, X may be a divalent functional group selected from the group consisting of the compounds of the following Chemical Formulae 31 to 34.

[Chemical Formula 31]

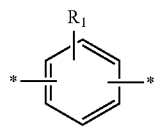

In Chemical Formula 31, $R_1$ may be hydrogen, —CH$_3$, —CH$_2$CH$_3$, —CH$_2$CH$_2$CH$_2$CH$_3$, —CF$_3$, —CF$_2$CF$_3$, —CF$_2$CF$_2$CF$_3$, or —CF$_2$CF$_2$CF$_2$CF$_3$.

[Chemical Formula 32]

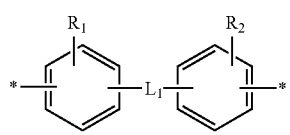

In Chemical Formula 32, $L_1$ may be a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O—, or —OCO(CH$_2$)$_{n3}$OCO—, n1, n2, and n3 are respectively an integer of 1 to 10, and $R_1$ and $R_2$ may be same as or different from each other and may respectively be hydrogen, —CH$_3$, —CH$_2$CH$_3$, —CH$_2$CH$_2$CH$_2$CH$_3$, —CF$_3$, —CF$_2$CF$_3$, —CF$_2$CF$_2$CF$_3$, or —CF$_2$CF$_2$CF$_2$CF$_3$.

[Chemical Formula 33]

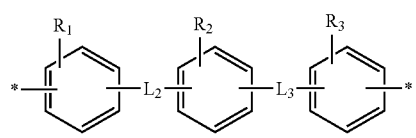

In Chemical Formula 33, $L_2$ and $L_3$ may be same as or different from each other and may respectively be a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O—, or —OCO(CH$_2$)$_{n3}$OCO—, n1, n2, and n3 may respectively be an integer of 1 to 10, and $R_1$, $R_2$, and $R_3$ may be same as or different from each other and may respectively be hydrogen, —CH$_3$, —CH$_2$CH$_3$, —CH$_2$CH$_2$CH$_2$CH$_3$, —CF$_3$, —CF$_2$CF$_3$, —CF$_2$CF$_2$CF$_3$, or —CF$_2$CF$_2$CF$_2$CF$_3$.

[Chemical Formula 34]

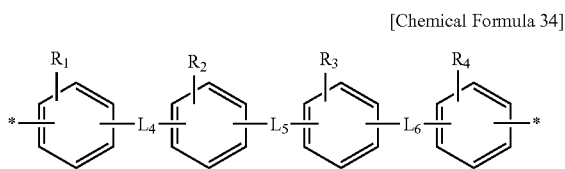

In Chemical Formula 34, $L_4$, $L_5$, and $L_6$ may be the same as or different from each other and may respectively be a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, —OCH$_2$—C(CH$_3$)$_2$—CH$_2$O—, or —OCO(CH$_2$)$_{n3}$OCO—, n1, n2, and n3 may respectively be an integer of 1 to 10, and $R_1$, $R_2$, $R_3$, and $R_4$ may be same as or different from each other and are respectively hydrogen, —CH$_3$, —CH$_2$CH$_3$, —CH$_2$CH$_2$CH$_2$CH$_3$, —CF$_3$, —CF$_2$CF$_3$, —CF$_2$CF$_2$CF$_3$, or —CF$_2$CF$_2$CF$_2$CF$_3$. Particularly, when X of Chemical Formula 1 is the divalent functional group of the following Chemical Formula 35, the flexible metal laminate of one embodiment can have a lower dielectric constant and lower moisture regain and can secure an optimized coefficient of thermal expansion in company with a high elastic modulus. In Chemical Formula 1, X of each repeating unit may be same as or different from each other.

[Chemical Formula 35]

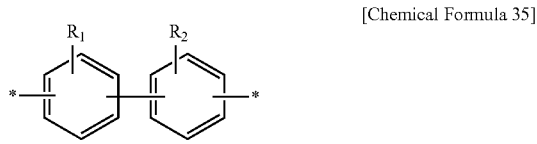

In Chemical Formula 35, $R_1$ and $R_2$ may be same as or different from each other and may respectively be —CH$_3$, —CH$_2$CH$_3$, —CH$_2$CH$_2$CH$_2$CH$_3$, —CF$_3$, —CF$_2$CF$_3$, —CF$_2$CF$_2$CF$_3$, or —CF$_2$CF$_2$CF$_2$CF$_3$. Meanwhile, the polymer resin layer may include 20 or 95 weight %, or 40 to 90 weight %, of the polyimide resin including the repeating unit of Chemical Formula 1 versus the rest of the fluororesin.

If the content of the fluororesin is too small, the flexible metal laminate finally prepared may not secure a sufficiently low dielectric constant or moisture regain. And, if the content of the fluororesin is too large, there may be a problem that the mechanical properties of the flexible metal laminate get worse and may be easily torn or broken, and the coefficient of thermal expansion of the polymer resin layer included in the flexible metal laminate may largely increase.

The fluororesin may include one or more fluororesins selected from the group consisting of polytetrafluoroethylene (PTFE), a tetrafluoroethylene-perfluoroalkylvinylether copolymer (PFA), a tetrafluoroethylene-hexafluoropropylene copolymer (FEP), an ethylene-tetrafluoroethylene copolymer resin (ETFE), a tetrafluoroethylene-chlorotrifluoroethylene copolymer (TFE/CTFE), and an ethylene-chlorotrifluoroethylene resin (ECTFE).

The fluororesin may include a particle having a longest diameter of 0.05 μm to 20 μm, or 0.1 μm to 10 μm. If the longest diameter of the fluororesin is too small, the properties of the polymer resin layer may decrease or more of the dispersing agent disclosed below may be required because the surface area of the fluororesin increases.

Further, if the longest diameter of the fluororesin is too large, the surface property of the prepared polymer resin layer may fall or the dispersity of the polymer composition solution for preparing the polymer resin layer may fall.

Meanwhile, the flexible metal laminate of one embodiment may further include a dispersing agent dispersed in the polymer resin layer.

The polymer resin layer may be formed from a resin composition including a polyamic acid, a fluororesin, and a certain dispersing agent, and the fluororesin can be more distributed through the inside of the polymer resin layer than at the surface of the same, the content of the fluororesin can increase with the depth toward the inside of the polymer resin, or the content of the fluororesin per unit volume of the polymer resin can be the minimum at the surface of the polymer resin, according to use of the dispersing agent.

As specific examples of the dispersing agent, a polyester-based polymer, a polyether modified polydimethylsiloxane, a polyester/polyamine polymer, or a mixture of two or more of them may be used. By using such compounds, the fluororesin may exhibit the distribution aspect disclosed above in the polymer resin layer included in the flexible metal laminate, and thus the flexible metal laminate or the printed circuit board can have a low dielectric constant and low moisture regain and can secure high elasticity and an optimized coefficient of thermal expansion.

Heretofore, methods of using a fluorine-based dispersing agent or a fluorine-based surfactant for dispersing a fluororesin in a polyamic acid or a polyimide have been known. However, according to such prior methods, it is possible to reduce the dielectric constant of the prepared polymer resin layer but the coefficient of thermal expansion of the prepared polymer resin layer may largely increase because of using the fluorine-based dispersing agent or the fluorine-based surfactant.

Furthermore, in the case of using the fluorine-based dispersing agent or the fluorine-based surfactant, the fluororesin may be concentrated at the surface rather than the inside of the prepared polymer resin layer of the polyimide, and when the polymer resin layer is exposed to a high temperature, for example a temperature of around 380° C. which may be applied during the preparation of the flexible metal laminate or the printed circuit board, the fluororesin may melt or part of the flexible metal laminate or the printed circuit board may be exfoliated.

Heretofore, the methods of adding a fluoropolymer resin to polymer resins such as a polyimide being applied to a flexible metal laminate in order to lower the dielectric constant have been known. However, the overall coefficient of thermal expansion cannot help but increase because the coefficients of thermal expansion of polytetrafluoroethylene (PTFE), a tetrafluoroethylene-hexafluoropropylene copolymer (FEP), and perfluoroalkox (PFA), the representative fluororesins, reach 135 ppm, 150 ppm, and 230 ppm, respectively, and they are considerably larger than 10 to 30 ppm, the coefficient of thermal expansion of a common polyimide, and about 10 to 60 wt % of such fluororesin is required in order to sufficiently lower the dielectric constant of a polyimide.

The dispersing agent may have density of 0.92 g/ml to 1.2 g/ml, or 0.95 g/ml to 1.15 g/ml, at 20° C.

The dispersing agent may have an acid value of 20 to 30 mg KOH/g.

Further, the dispersing agent may have a base equivalent of 1000 to 1700.

The polymer resin layer may include 0.1 to 25 parts by weight, or 0.5 to 10 parts by weight, of the dispersing agent per 100 parts by weight of the fluororesin.

If the content of the dispersing agent is too small, the fluororesin may agglomerate, and the appearance property or the uniformity of the polymer resin layer may deteriorate and the uniformity of the polymer resin composition solution for preparing the polymer resin layer may decrease. And, if the content of the dispersing agent is too large, the elastic modulus or the mechanical property of the polymer resin layer may fall.

Meanwhile, the polymer resin layer included in the flexible metal laminate may have a thickness of 0.1 μm to 100 μm, or 1 μm to 50 μm.

The flexible metal laminate may exhibit a dielectric constant (Dk) of 2.2 to 2.8, or 2.3 to 2.7, in a dried condition at 5 GHz. A common polyimide resin generally has a dielectric constant of 3.0 or more in a dried condition at 5 GHz, but the above flexible metal laminate of one embodiment can have a relatively low dielectric constant by including said polymer resin layer. The flexible metal laminate may have a coefficient of thermal expansion of 1 ppm to 28 ppm at 100° C. to 200° C.

The polymer resin layer may have a relatively low coefficient of thermal expansion, for example 1 ppm to 20 ppm, and the flexible metal laminate including the polymer resin layer or further including a polyimide layer on at least one face of the polymer resin layer may have a coefficient of thermal expansion of 1 ppm to 28 ppm, or 15 ppm to 25 ppm.

Since the coefficient of thermal expansion of a copper foil, a metal foil usually used, is about 18 ppm, a bending phenomenon due to the difference in the coefficient of thermal expansion from the metal foil and a phenomenon of generating a difference in flexibility from other materials composing the printed circuit board can be minimized by making the coefficient of thermal expansion of the flexible metal laminate into the above range.

Meanwhile, the flexible metal laminate may include one or more metal thin films including one or more selected from the group consisting of copper, iron, nickel, titanium, aluminum, silver, gold, and an alloy of two or more of them.

Specifically, the flexible metal laminate may include one metal film or two metal films opposing each other, and in the latter case, the polymer resin layer may be located between two metal films opposing each other.

The ten point average roughness (Rz) of the surface of the metal thin film may be 0.5 μm to 2.5 μm. When the ten point average roughness of the surface of the metal thin film is too small, the adhesive strength with the polymer resin layer may be high, and when the ten point average roughness of the surface of the metal thin film is too high, the transmission loss in a high frequency range may grow because of the increased surface roughness.

The metal thin film may have the thickness of 0.1 μm to 50 μm.

The flexible metal laminate may further include a polyimide resin layer formed on at least one face of the polymer resin layer.

Specifically, the flexible metal laminate may further include second and third polyimide resin layers connected to both faces of the polymer resin layer. The second and third polyimide resins may be the same as or different from the polyimide resin disclosed above, respectively.

Furthermore, the second and the third polyimide resin may have the thickness same to or different from the polymer resin layer, and may have the thickness of 0.1 μm to 100 μm, or 1 μm to 50 μm.

The preparation method of the flexible metal laminate is not particularly limited, and commonly known synthetic methods of polyimide resins and preparation methods of flexible metal laminates may be used. The polyimide resin included in the polymer resin layer may be prepared by coating and drying the polymer resin solution including a polyamic acid, a precursor, followed by heat-treating the same at a high temperature of 250° C. to 400° C.

Further, the polyamic acid, the precursor of the polyimide resin, may be obtained by reacting a tetracarboxylic acid or an anhydride of the same with a diamine compound, and for example, it can be obtained by reacting a tetracarboxylic acid including the tetravalent functional group selected from the group consisting of the compounds of Chemical Formulae 21 to 27 or an anhydride of the same with a diamine compound including the divalent functional group selected from the group consisting of the compounds of Chemical Formulae 31 to 34.

The composition including a polyamic acid, a fluororesin, and a dispersing agent may include an organic solvent. Examples of usable organic solvents are not particularly limited, and for example, N,N'-dimethylformamide, N,N'-dimethylacetamide, N,N'-diethylacetamide, N,N'-dimethylmethoxyacetamide, N-methyl-2-pyrrolidone, N-methylcaprolactam, 1,3-dimethyl-2-imidazolidone, 1,2-dimethoxyethane, 1,3-dioxane, 1,4-dioxane, pyridine, picoline, dimethylsulfoxide, dimethylsulfone, m-cresol, p-chlorophenol, anisole, and so on may be used, and they may be used solely or by mixing two or more of them.

The organic solvent may be used in the amount of about 2 to 8 times the total solid content of the resin composition.

Advantageous Effect of the Invention

According to the present invention, a flexible metal laminate which has a low dielectric constant and low moisture regain and can secure high elasticity and an optimized coefficient of thermal expansion can be provided.

Accordingly, the present invention provides a method of preparing a low dielectric constant polyimide having the characteristics of high heat resistance, chemical resistance, and dimensional stability the same as prior polyimide insulators, in addition to a low dielectric constant, as the solution to an increase of data loss caused by an increase of data transmission speed of recent electronic devices such as a laptop (notebook), a computer, a mobile phone, and so on, the thickening of a printed circuit board, and the narrowing of a circuit in a printed circuit board. Furthermore, the present invention provides a method of preparing a low dielectric constant copper foil laminate by using the low dielectric constant polyimide prepared by such method.

According to this, the printed circuit board can be prepared more thinly with matching impedance and it becomes possible to prepare portable electronic devices more thinly, and it can innovatively reduce the defect rate of PCB manufacturing companies and can contribute to a preparation cost reduction because the line width of printed circuit board can be wide.

DETAILS FOR PRACTICING THE INVENTION

Figure 1:
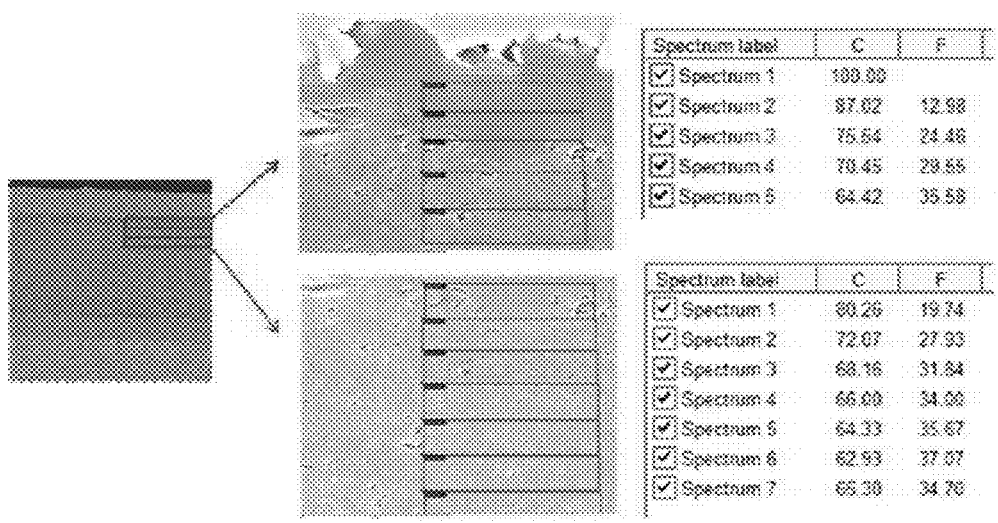
FIG. 1 represents a SEM photograph and an EDS result of a cross-section of the copper foil laminate obtained in Example 8.

The present invention is explained in more detail in the following examples. However, the following examples are only for illustrating the present invention and the details of the present invention are not limited to or by them.

PREPARATION EXAMPLES

Preparation of Polyamic Acid Solution

Preparation Example 1

Preparation of Polyamic Acid Solution (P1) Including Fluororesin

After filling nitrogen in a 1 L polyethylene (PE) bottle and adding 765 g of dimethylacetamide (DMAc), 219 g of polytetrafluoroethylene (PTFE) micro-powder (particle size: 0.1 to 2.0 μm), 10.95 g of a polyester-based polymer [acid value: 26 mg KOH/g, base equivalent: 1200] as a dispersing agent, and 765 g of beads having a diameter of 2 mm thereto, the resultant mixture was stirred in a high speed ball milling apparatus so as to disperse PTFE. After putting 80 g of the solution in which said PTFE was dispersed, 107 g of dimethylacetamide, 1.852 g of 3,4,3',4'-biphenyltetracarboxylic dianhydride, 12.355 g of pyromellitic dianhydride, 5.453 g of 2,2'-dimethyl-4,4'-diaminobiphenyl, 12.340 g of 2,2'-bis(trifluoromethyl)-4,4'-diaminobiphenyl in a 500 mL round bottom flask, the mixture was stirred with a stirrer and reacted at 50° C. for 10 hours while streaming nitrogen therein so as to obtain a polyamic acid solution (P1) having a viscosity of about 25,000 cps.

Preparation Example 2

Preparation of Polyamic Acid Solution (P2) Including Fluororesin

After filling nitrogen in a 1 L polyethylene (PE) bottle and adding 765 g of dimethylacetamide (DMAc), 219 g of polytetrafluoroethylene (PTFE) micro-powder (particle size: 0.1 to 2.0 μm), 10.95 g of a polyester-based polymer [acid value: 26 mg KOH/g, base equivalent: 1200] as a dispersing agent, and 765 g of beads having a diameter of 2 mm thereto, the resultant mixture was stirred in a high speed ball milling apparatus so as to disperse PTFE. After putting 73 g of the solution in which said PTFE was dispersed, 115 g of dimethylacetamide, 11.609 g of pyromellitic dianhydride, 17.391 g of 2,2'-bis(trifluoromethyl)-4,4'-diaminobiphenyl in a 500 mL round bottom flask, the mixture was stirred with a stirrer and reacted at 50° C. for 10 hours while streaming nitrogen therein so as to obtain a polyamic acid solution (P2) having viscosity of about 100,000 cps.

Preparation Example 3

Preparation of Polyamic Acid Solution (P3) Including Fluororesin

After filling nitrogen in a 1 L polyethylene (PE) bottle and adding 765 g of dimethylacetamide (DMAc), 219 g of polytetrafluoroethylene (PTFE) micro-powder (particle size: 0.1 to 2.0 μm), 10.95 g of a polyester-based polymer [density (20 ℃): 1.13 g/ml] as a dispersing agent, and 765 g of beads having a diameter of 2 mm thereto, the resultant mixture was stirred in a high speed ball milling apparatus so as to disperse PTFE.

After putting 80 g of the solution in which said PTFE was dispersed, 107 g of dimethylacetamide, 13.937 g of pyromellitic dianhydride, 5.536 g of 2,2'-dimethyl-4,4'-diaminobiphenyl (m-TB-HG), 12.527 g of 2,2'-bis(trifluoromethyl)-4,4'-diaminobiphenyl in a 500 mL round bottom flask, the resultant mixture was stirred with a stirrer and reacted at 50° C. for 10 hours while streaming nitrogen therein so as to obtain a polyamic acid solution (P3) having viscosity of about 20,000 cps.

Preparation Example 4

Preparation of Polyamic Acid Solution (P4)

After putting 187 g of dimethylacetamide (DMAc), 12.355 g of pyromellitic dianhydride (PMDA), 1.852 g of 3,4,3',4'-biphenyltetracarboxylic dianhydride (BPDA), 5.453 g of 2,2'-dimethyl-4,4'-diaminobiphenyl (m-TB-HG), 12.340 g of 2,2'-bis(trifluoromethyl)-4,4'-diaminobiphenyl (2,2'-TFDB) in a 500 mL round bottom flask, the resultant mixture was stirred with a stirrer and reacted at 50° C. for 10 hours while streaming nitrogen therein so as to obtain a polyamic acid solution (P4) having viscosity of about 20,000 cps.

Preparation Example 5

Preparation of Polyamic Acid Solution (P5)

After putting 200 g of dimethylacetamide (DMAc), 10.00 g of pyromellitic dianhydride (PMDA), and 18.82 g of ([aminophenoxy]-phenyl)propane (BAPP) in a 500 mL round bottom flask, the resultant mixture was stirred with a stirrer and reacted at 50° C. for 10 hours while streaming nitrogen therein so as to obtain a polyamic acid solution (P5) having viscosity of about 5000 cps.

Preparation Example 6

Preparation of Polyamic Acid Solution (P6)

After putting 200 g of dimethylacetamide (DMAc), 26.65 g of 3,4,3',4'-biphenyltetracarboxylic dianhydride (BPDA), and 9.98 g of p-phenylene diamine (PDA) in a 500 mL round bottom flask, the resultant mixture was stirred with a stirrer and reacted at 50° C. for 10 hours while streaming nitrogen therein so as to obtain a polyamic acid solution (P6) having viscosity of about 5000 cps.

Preparation Example 7

Preparation of Polyamic Acid Solution (P7) Including Fluororesin

After filling nitrogen in a 1 L polyethylene (PE) bottle and adding 765 g of dimethylacetamide (DMAc), 219 g of polytetrafluoroethylene (PTFE) micro-powder (particle size: 0.1 to 2.0 μm), 10.95 g of a polyester-based polymer [acid value: 26 mg KOH/g, base equivalent: 1200] as a dispersing agent, and 765 g of beads having a diameter of 2 mm thereto, the resultant mixture was stirred in a high speed ball milling apparatus so as to disperse PTFE. After putting 75 g of the solution in which said PTFE was dispersed, 112 g of dimethylacetamide (DMAc), 21.817 g of 3,4,3',4'-biphenyltetracarboxylic dianhydride (BPDA), and 8.183 g of p-phenylene diamine (PDA) in a 500 mL round bottom flask, the mixture was stirred with a stirrer and reacted at 50° C. for 10 hours while streaming nitrogen therein so as to obtain a polyamic acid solution (P7) having viscosity of about 35,000 cps.

Examples 1 to 3 and Comparative Examples 1 to 3

Preparation of Polyimide Resin Film for Flexible Metal Laminate

Examples 1 to 3

Each of the polyamic acid solutions prepared in Preparation Examples 1 to 3 was coated on a matte surface of a copper foil (thickness: 12 μm) so that the final thickness became 25 μm and dried at 80° C. for 10 minutes. The dried product was heated from room temperature and hardened at 350° C. for 30 minutes in a nitrogen oven. After the hardening was completed, a polyimide film having the thickness of 25 μm was obtained by etching the copper foil.

Example 4

A polyimide film having a thickness of 25 μm was prepared substantially according to the same method as in Example 1, except that the polyamic acid solution (P7) prepared in Preparation Example 7 was used instead of the polyamic acid solution (P1) prepared in Preparation Example 1.

Comparative Examples 1 to 3

A polyimide film having a thickness of 25 μm was prepared substantially according to the same method as in Example 1, except that the polyamic acid solutions prepared in Preparation Examples 4 to 6 were used respectively instead of the polyamic acid solution (P1) prepared in Preparation Example 1.

Examples 5 to 10 and Comparative Example 4

Preparation of Flexible Metal Laminate

Example 5

The polyamic acid solution prepared in Preparation Example 5 was coated on a matte surface of a copper foil (thickness: 12 μm) so that the final thickness became 2 μm and dried at 80° C. for 10 minutes. The polyamic acid solution (P1) prepared in Preparation Example 1 was coated on said dried surface so that the final thickness became 20 μm and dried at 80° C. for 10 minutes. A laminate was obtained by coating the polyamic acid solution (P5) prepared in Preparation Example 5 on the dried surface of the polyamic acid solution (P1) so that the final thickness became 3 μm and drying the same at 80° C. for 10 minutes. The dried laminate was heated from room temperature and hardened at 350° C. for 30 minutes in a nitrogen oven, and a flexible copper foil laminate of which one surface was a copper foil was obtained.

Examples 6 to 7

A flexible copper foil laminate of which one surface was a copper foil was obtained substantially according to the same method as in Example 5, except that the polyamic acid solutions (P2 and P3) prepared in Preparation Examples 2 and 3 were used respectively instead of the polyamic acid solution (P1) prepared in Preparation Example 1.

Example 8

The polyamic acid solution prepared in Preparation Example 5 was coated on a matte surface of a copper foil (thickness: 12 μm) so that the final thickness became 2 μm and dried at 80° C. for 10 minutes. The polyamic acid solution (P1) prepared in Preparation Example 1 was coated on said dried surface so that the final thickness became 20 μm and dried at 80° C. for 10 minutes. A laminate was obtained by coating the polyamic acid solution (P5) prepared in Preparation Example 5 on the dried surface of the polyamic acid solution (P1) so that the final thickness became 3 μm and drying the same at 80° C. for 10 minutes. The dried laminate was heated from room temperature and hardened at 350° C. for 30 minutes in a nitrogen oven, and a flexible copper foil laminate having opposing copper foils connected to both its surfaces was obtained by connecting another copper foil (thickness: 12 μm) to the surface of the hardened layer opposing the copper foil at a temperature of 400° C.

Examples 9 to 10

A flexible copper foil laminate having opposing copper foils connected to both its surfaces was obtained substantially according to the same method as in Example 8, except that the polyamic acid solutions (P2 and P3) prepared in Preparation Examples 2 and 3 were used respectively instead of the polyamic acid solution (P1) prepared in Preparation Example 1.

Example 11

A flexible copper foil laminate having opposing copper foils connected to both its surfaces was obtained substantially according to the same method as in Example 8, except that the polyamic acid solution (P7) prepared in Preparation Example 7 was used instead of the polyamic acid solution (P1) prepared in Preparation Example 1.

EXPERIMENTAL EXAMPLES

1. Experimental Example 1

Observation of Cross-Section of Flexible Metal Laminate

Figure 2:
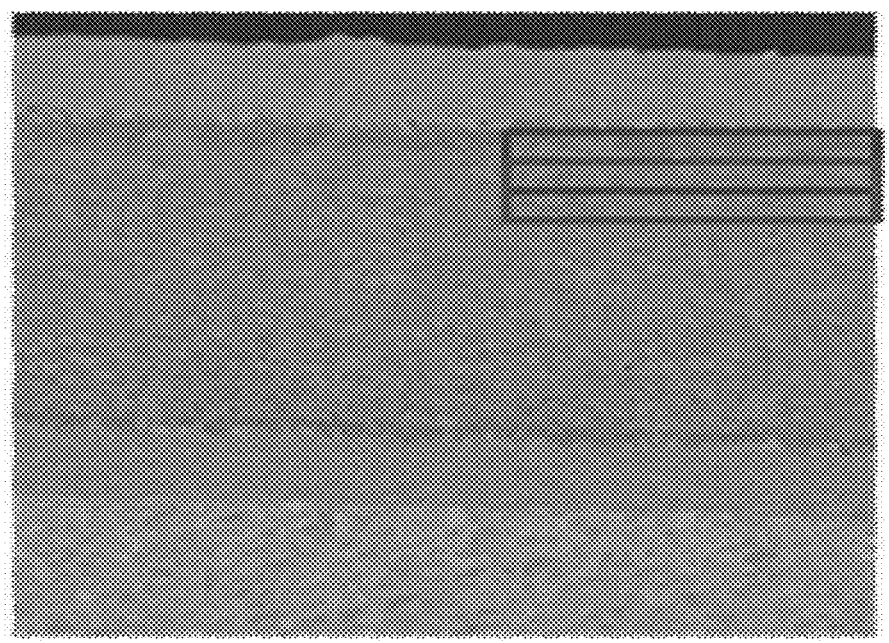
FIG. 2 is a magnified photograph of the SEM photograph of FIG. 1.

The cross-section of the copper foil laminate obtained in Example 8 was observed with a SEM photo. As illustrated in FIGS. 1 and 2, it was recognized that the fluororesin was more distributed through the inside than the outer surface of the polyimide resin layer of the flexible metal laminate prepared in Example 8. Furthermore, it was recognized that the content of the fluororesin increased until a certain depth, for example until about 20% of the total thickness, from the surface of the polyimide resin layer of the flexible metal laminate.

2. Experimental Example 2

Measurement of Properties of Flexible Metal Laminate

The dielectric constant, CTE, and moisture regain of the copper foil laminates prepared in the examples and comparative examples were measured as follows, and the results are listed in the following Table 1.

(1) Method of Measuring Dielectric Constant

After drying the polyimide films obtained in Examples 1 to 3 and Comparative Examples 1 to 3 and the polyimide film laminates obtained by etching copper foils and eliminating the same from the flexible copper foil laminates of Examples 4 to 11 at 150° C. for 30 minutes, the dielectric constant of each polyimide film or polyimide film laminate was measured in the condition of 25° C. and 50% RH by using a resonator (Agiletn E5071B ENA device) according to a split post dielectric resonance (SPDR) method.

(2) Method of Measuring Coefficient of Thermal Expansion

The coefficient of thermal expansion of the polyimide films obtained in Examples 1 to 3 and Comparative Examples 1 to 3 and the polyimide film laminates obtained by etching copper foils and eliminating the same from the flexible copper foil laminates of Examples 4 to 11 was measured in the measuring condition of 100° C. to 200° C. by using TMA/SDTA 840 device of Mettler Co., based on the standard of IPC TM-650 2.4.24.3.

(3) Method of Measuring Moisture Regain

After dipping the polyimide films obtained in Examples 1 to 3 and Comparative Examples 1 to 3 and the polyimide film laminates obtained by etching copper foils and eliminating the same from the flexible copper foil laminates of Examples 4 to 11 in distilled water of 23° C. for 24 hours, the moisture regain was calculated from the masses of the films and the laminates before and after dipping, based on the standard of IPC TM-650 2.6.2C.

TABLE 1

Results of measurement of Experimental Example 2

| | Polyamic acid solution | | | Results of measurement of Experimental Example 2 | | |
|---|---|---|---|---|---|---|
| Classifications | Tetracarboxylic acid or Anhydride | Diamine | Content of PTFE (weight %) | Dielectric constant (Dk) @ 5 GHz | CTE (ppm) | Moisture regain (%) |
| Example 1 | PDMA/BPDA | m-TB-HG/TFDB | 35 | 2.53 | 4 | 0.8 |
| Example 2 | PDMA | TFDB | 35 | 2.48 | 3 | 0.7 |
| Example 3 | PDMA | m-TB-HG/TFDB | 35 | 2.52 | 3 | 0.8 |
| Example 4 | BPDA | PDA | 35 | 2.75 | 10 | 1.2 |
| Example 5 | PDMA/BPDA | m-TB-HG/TFDB | 35 | 2.55 | 19 | 0.8 |
| Example 6 | PDMA | TFDB | 35 | 2.50 | 22 | 0.8 |
| Example 7 | PDMA | m-TB-HG/TFDB | 35 | 2.54 | 18 | 0.9 |
| Example 8 | PDMA/BPDA | m-TB-HG/TFDB | 35 | 2.53 | 19 | 0.8 |
| Example 9 | PDMA | TFDB | 35 | 2.49 | 22 | 0.8 |
| Example 10 | PDMA | m-TB-HG/TFDB | 35 | 2.52 | 18 | 0.9 |
| Example 11 | BPDA | PDA | 35 | 2.74 | 27 | 1.2 |
| Comparative Example 1 | PDMA/BPDA | m-TB-HG/TFDB | 0% | 3.01 | −6 | 1.7 |
| Comparative Example 2 | PDMA | BAPP | 0% | 2.85 | 50 | 1.5 |
| Comparative Example 3 | BPDA | PDA | 0% | 3.25 | 5 | 2.5 |

* In Table 1, the components of the polyamic acid of Examples 5 to 11 relate to the precursor of the polyimide film positioned at the middle layer of the polyimide films of the flexible copper foil laminate.

As shown in Table 1, it was recognized that the polyimide films obtained in Examples 1 to 3 have low dielectric constants and low moisture regain in comparison with the polyimide films of Comparative Examples 1 to 3, and have an optimized range (for example, 1 ppm to 20 ppm) of the coefficient of thermal expansion. In contrast, it was recognized that the polyimide films of Comparative Examples 1 to 3 have relatively high dielectric constants (for example, 2.8 or more, or 3.0 or more) and high moisture regain (for example, 1.5% or more).

Meanwhile, it was recognized that the copper foil metal laminates prepared in Examples 5 to 11 secure the dielectric constant of 2.80 or less and the moisture regain of 1.2 or less, and can control the coefficient of thermal expansion of the laminate structure except the copper foil in the range of 18 ppm to 28 ppm. Particularly, it was recognized that it is possible to secure a lower dielectric constant and lower moisture regain while maintaining an appropriate coefficient of thermal expansion by including the polyimide films obtained from the polyamic acid synthesized by using specific monomers (Examples 5 to 10).

What is claimed is:

1. A flexible metal laminate, including a polymer resin layer including a polyimide resin including a repeating unit represented by the following Chemical Formula 1, a dispersing agent dispersed in the polymer resin layer, and a fluororesin,
    wherein the fluororesin is more distributed through the inside of the polymer resin layer than at both surfaces of the polymer resin layer:

[Chemical Formula 1]

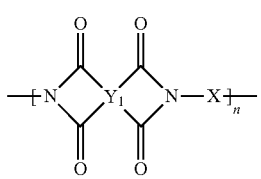

wherein, in Chemical Formula 1, $Y_1$ is a tetravalent aromatic organic functional group, X is a divalent aromatic organic functional group, and n is an integer of 1 to 300, the dispersing agent includes one or more polymers selected from the group consisting of a polyester-based polymer, a polyether modified polydimethylsiloxane, and a polyester/polyamine polymer, the polymer resin layer has a dielectric constant of 2.2 to 2.8 at 5 GHz, wherein the content of the fluororesin per unit volume of the polymer resin layer increases with the depth until 20% of the total thickness from both surfaces of the polymer resin layer, and the flexible metal laminate has a coefficient of thermal expansion of 1 ppm to 28 ppm at 100° C. to 200° C.

2. The flexible metal laminate according to claim 1, wherein the content of the fluororesin per unit volume of the polymer resin layer is a minimum at one of both surfaces of the polymer resin layer.

3. The flexible metal laminate according to claim 1, wherein the weight ratio of the polyimide resin:the fluororesin per unit volume of the polymer resin layer is 100:0 to 60:40 at the depth of 20% of the total thickness from both surfaces of the polymer resin layer.

4. The flexible metal laminate according to claim 1, wherein the weight ratio of the polyimide resin to the fluororesin per unit volume of the polymer resin layer is 75:25 to 25:75 at a depth of 40% to 60% of the total thickness of the polymer resin layer.

5. The flexible metal laminate according to claim 1, wherein $Y_1$ is a tetravalent functional group selected from the group consisting of compounds of the following Chemical Formulae 21 to 27:

[Chemical Formula 21]

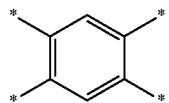

[Chemical Formula 22]

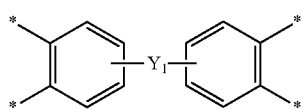

wherein, in Chemical Formula 22, $Y_1$ is single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are respectively an integer of 1 to 10,

[Chemical Formula 23]

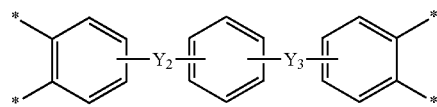

wherein, in Chemical Formula 23, $Y_2$ and $Y_3$ are same as or different from each other and are respectively a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are respectively an integer of 1 to 10,

[Chemical Formula 24]

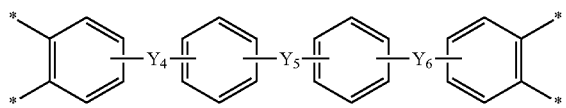

wherein, in Chemical Formula 24, $Y_4$, $Y_5$, and $Y_6$ are same as or different from each other and are respectively a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —OCO(CH$_2$)$_{n3}$OCO—, and n1, n2, and n3 are respectively an integer of 1 to 10,

[Chemical Formula 25]

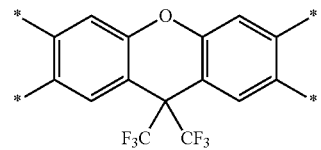

[Chemical Formula 26]

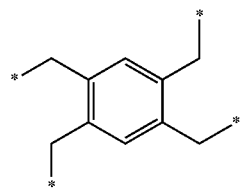

[Chemical Formula 27]

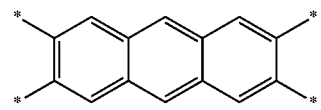

wherein, in Chemical Formulae 21 to 27, "*" means a bonding point.

6. The flexible metal laminate according to claim 1, wherein $Y_1$ is a tetravalent functional group selected from the group consisting of compounds of the following Chemical Formulae 28 to 30:

[Chemical Formula 28]

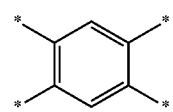

-continued

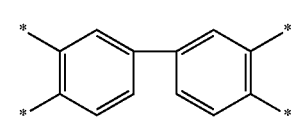
[Chemical Formula 29]

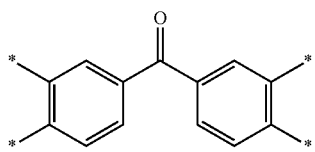
[Chemical Formula 30]

wherein, in Chemical Formulae 28 to 30, "*" means a bonding point.

7. The flexible metal laminate according to claim 1, wherein X is a divalent functional group selected from the group consisting of compounds of the following Chemical Formulae 31 to 34:

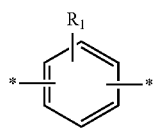
[Chemical Formula 31]

wherein, in Chemical Formula 31, $R_1$ is hydrogen, —$CH_3$, —$CH_2CH_3$, —$CH_2CH_2CH_2CH_3$, —$CF_3$, —$CF_2CF_3$, —$CF_2CF_2CF_3$, or —$CF_2CF_2CF_2CF_3$,

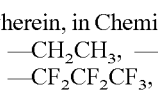
[Chemical Formula 32]

wherein, in Chemical Formula 32, $L_1$ is a single bond, —O—, —CO—, —S—, —$SO_2$—, —$C(CH_3)_2$—, —$C(CF_3)_2$—, —CONH—, —COO—, —$(CH_2)_{n1}$—, —$O(CH_2)_{n2}O$—, —$OCH_2$—$C(CH_3)_2$—$CH_2O$—, or —$OCO(CH_2)_{n3}OCO$—, n1, n2, and n3 are respectively an integer of 1 to 10, and $R_1$ and $R_2$ are the same as or different from each other and are respectively hydrogen, —$CH_3$, —$CH_2CH_3$, —$CH_2CH_2CH_2CH_3$, —$CF_3$, —$CF_2CF_3$, —$CF_2CF_2CF_3$, or —$CF_2CF_2CF_2CF_3$,

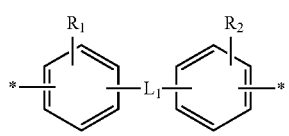
[Chemical Formula 33]

wherein, in Chemical Formula 33, $L_2$ and $L_3$ are the same as or different from each other and are respectively a single bond, —O—, —CO—, —S—, —$SO_2$—, —$C(CH_3)_2$—, —$C(CF_3)_2$—, —CONH—, —COO—, —$(CH_2)_{n1}$—, —$O(CH_2)_{n2}O$—, —$OCH_2$—$C(CH_3)_2$—$CH_2O$—, or —$OCO(CH_2)_{n3}OCO$—, n1, n2, and n3 are respectively an integer of 1 to 10, and $R_1$, $R_2$, and $R_3$ are the same as or different from each other and are respectively hydrogen, —$CH_3$, —$CH_2CH_3$, —$CH_2CH_2CH_2CH_3$, —$CF_3$, —$CF_2CF_3$, —$CF_2CF_2CF_3$, or —$CF_2CF_2CF_2CF_3$,

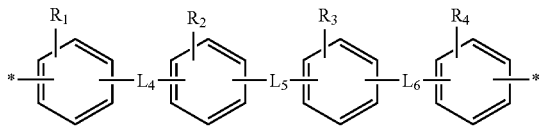
[Chemical Formula 34]

wherein, in Chemical Formula 34, $L_4$, $L_5$, and $L_6$ are the same as or different from each other and are respectively a single bond, —O—, —CO—, —S—, —$SO_2$—, —$C(CH_3)_2$—, —$C(CF_3)_2$—, —CONH—, —COO—, —$(CH_2)_{n1}$—, —$O(CH_2)_{n2}O$—, —$OCH_2$—$C(CH_3)_2$—$CH_2O$—, or —$OCO(CH_2)_3OCO$—, n1, n2, and n3 are respectively an integer of 1 to 10, and $R_1$, $R_2$, $R_3$, and $R_4$ are the same as or different from each other and are respectively hydrogen, —$CH_3$, —$CH_2CH_3$, —$CH_2CH_2CH_2CH_3$, —$CF_3$, —$CF_2CF_3$, —$CF_2CF_2CF_3$, or —$CF_2CF_2CF_2CF_3$, and in Chemical Formulae 31 to 34, "*" means a bonding point.

8. The flexible metal laminate according to claim 1, wherein X is a divalent functional group of the following Chemical Formula 35:

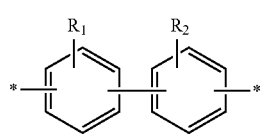
[Chemical Formula 35]

wherein, in Chemical Formula 35, $R_1$ and $R_2$ are the same as or different from each other and are respectively —$CH_3$, —$CH_2CH_3$, —$CH_2CH_2CH_2CH_3$, —$CF_3$, —$CF_2CF_3$, —$CF_2CF_2CF_3$, or —$CF_2CF_2CF_2CF_3$.

9. The flexible metal laminate according to claim 1, wherein the dispersing agent has a density of 0.92 g/ml to 1.2 g/ml at 20° C.

10. The flexible metal laminate according to claim 1, wherein the dispersing agent has an acid value of 20 to 30 mg KOH/g or a base equivalent of 1000 to 1700.

11. The flexible metal laminate according to claim 1, wherein the polymer resin layer includes 0.1 to 25 parts by weight of the dispersing agent per 100 parts by weight of the fluororesin.

12. The flexible metal laminate according to claim 1, wherein the fluororesin includes one or more selected from the group consisting of polytetrafluoroethylene (PTFE), a tetrafluoroethylene-perfluoroalkylvinylether copolymer (PFA), a tetrafluoroethylene-hexafluoropropylene copolymer (FEP), an ethylene-tetrafluoroethylene copolymer resin (ETFE), a tetrafluoroethylene-chlorotrifluoroethylene copolymer (TFE/CTFE), and an ethylene-chlorotrifluoroethylene resin (ECTFE).

13. The flexible metal laminate according to claim 1, wherein the fluororesin includes a particle having a longest diameter of 0.05 μm to 20 μm.

14. The flexible metal laminate according to claim 1, wherein the polymer resin layer includes 20 to 95 weight % of the polyimide resin including the repeating unit of Chemical Formula 1 and the remaining amounts of the fluororesin.

15. The flexible metal laminate according to claim 1, wherein the polymer resin layer has a thickness of 0.1 μm to 100 μm.

16. The flexible metal laminate according to claim 1, including one or more metal thin films including one or more selected from the group consisting of copper, iron, nickel, titanium, aluminum, silver, gold, and an alloy of two or more of them.

17. The flexible metal laminate according to claim 16, wherein ten point average roughness (Rz) of the surface of the metal thin film is 0.5 μm to 2.5 μm.

18. The flexible metal laminate according to claim 16, wherein the metal thin film has a thickness of 0.1 μm to 50 μm.

19. The flexible metal laminate according to claim 16, wherein the laminate includes two metal thin films opposing each other and the polymer resin layer located between the metal thin films opposing each other.

20. The flexible metal laminate according to claim 1, further including a polyimide resin layer formed on at least one face of the polymer resin layer.

21. The flexible metal laminate according to claim 20, wherein the polyimide resin layer has a thickness of 1 μm to 50 μm.

* * * * *